United States Patent [19]

Romann et al.

[11] Patent Number: 5,584,704
[45] Date of Patent: Dec. 17, 1996

[54] DEVICE FOR THE COMMON ELECTRICAL CONTACTING OF A PLURALITY OF ELECTRICALLY EXCITABLE AGGREGATES OF INTERNAL COMBUSTION ENGINES

[75] Inventors: Peter Romann, Stuttgart; Udo Hafner, Ludwigsburg, both of Germany

[73] Assignee: Robert Bosch GmbH, Stuttgart, Germany

[21] Appl. No.: 283,972

[22] Filed: Aug. 1, 1994

[30] Foreign Application Priority Data

Aug. 3, 1993 [DE] Germany ............ 43 25 980.4

[51] Int. Cl.⁶ .................................................. H01R 13/44
[52] U.S. Cl. .................................................. 439/130
[58] Field of Search .................................................. 439/130

[56] References Cited

U.S. PATENT DOCUMENTS

| | | | |
|---|---|---|---|
| 4,409,641 | 10/1983 | Jakob et al. | 439/83 |
| 4,722,364 | 2/1988 | Kubach et al. | 137/625.65 |
| 4,857,003 | 8/1989 | Hafner et al. | 439/130 |
| 4,866,463 | 12/1989 | Scott et al. | 439/89 |
| 4,950,171 | 8/1990 | Muzslay | 439/76 |
| 4,982,711 | 1/1991 | Gmelin | 123/399 |
| 5,030,116 | 7/1991 | Sakai et al. | 439/130 |
| 5,113,316 | 5/1992 | Navarro et al. | 439/65 |
| 5,238,415 | 8/1993 | Bittner et al. | 439/130 |
| 5,295,468 | 3/1994 | Blessing et al. | 439/130 |
| 5,347,969 | 9/1994 | Gmelin et al. | 439/130 |

Primary Examiner—Gary F. Paumen
Assistant Examiner—Jill DeMello
Attorney, Agent, or Firm—Kenyon & Kenyon

[57] ABSTRACT

Aggregates, such as fuel-injection valves, are directly connected via their connector pins to the printed-circuit board and do not necessitate any additional structural elements. The plug connector is designed so as not to lie or so as to lie only slightly above the plane of the printed-circuit board, so that, viewed in the extension direction of the fuel-injection valves, a very low overall height is attained for the device. Because of the small unit volume of the printed-circuit board, of the housing, and of the plug connector, the device requires comparatively little space. The device is especially suited for the common electrical contacting of electromagnetically actuated fuel-injection valves.

20 Claims, 9 Drawing Sheets

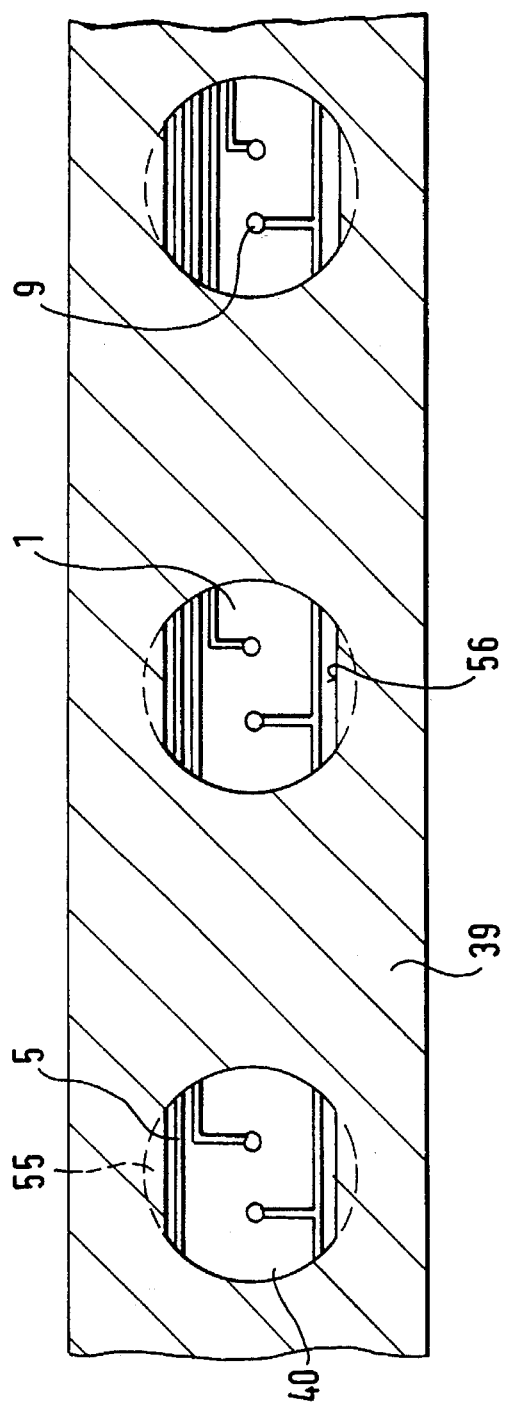
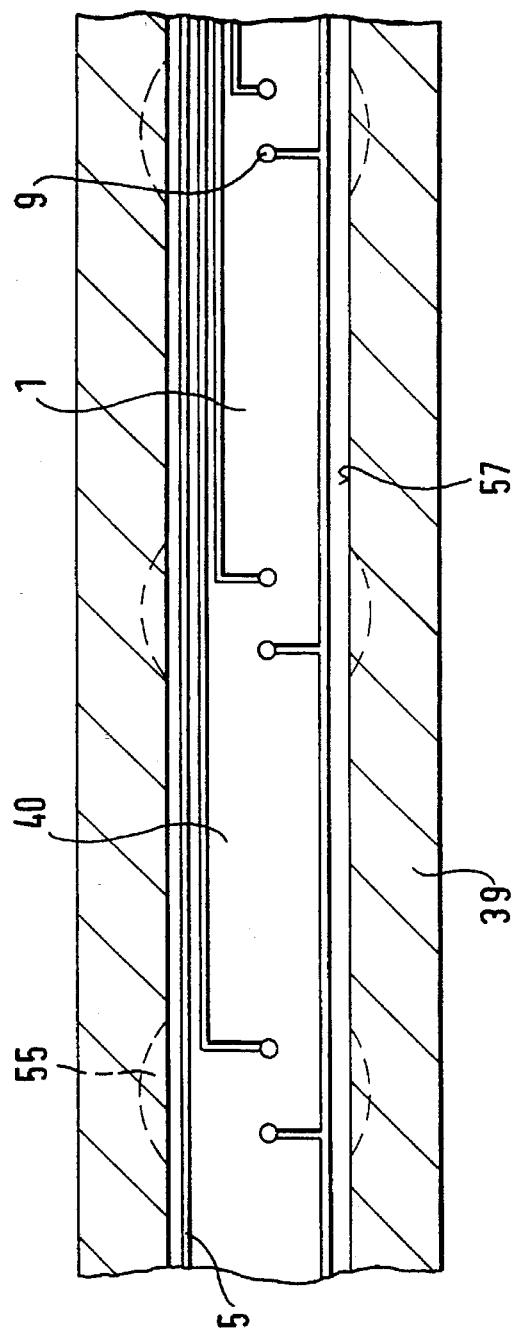

DEVICE FOR THE COMMON ELECTRICAL CONTACTING OF A PLURALITY OF ELECTRICALLY EXCITABLE AGGREGATES OF INTERNAL COMBUSTION ENGINES

FIELD OF THE INVENTION

The present invention relates to a device for the common electrical contacting of a plurality of electrically excitable aggregates, and in particular for contacting of electromagnetically actuated fuel-injection valves for internal combustion engines.

BACKGROUND INFORMATION

U.S. Pat. No. 4,950,171 describes a device in which a printed-circuit board, which is clamped between an upper and a lower housing part, serves to electrically contact fuel-injection valves installed in the housing parts. The contacting takes place in this case via conical contact fingers that are inserted into holes of the printed-circuit board and into which the two connector pins of each of the fuel-injection valves engage. The printed-circuit board ends at a plug connector, via which the signals from an external control unit are transmitted to the printed-circuit board and, thus, to the fuel-injection valves. In the plug-connector module, the printed-circuit board is installed substantially perpendicularly, and is, therefore, offset by 90° from the circuit-board plane, to which the fuel-injection valves are attached. The housing parts are accordingly shaped to reliably accommodate the printed-circuit board while providing protection. The housing parts surrounding the printed-circuit board are rigid parts, while the printed-circuit board can have a flexible design.

In such devices, a high level of complexity results because of the development of a multisectional housing and because of the introduction of conical contact fingers into holes of the printed-circuit board, into which engage the connector pins of the aggregates being used. The angling of the printed-circuit board in the area of a plug connector further increases the overall height of the device in the extension direction of the aggregates.

SUMMARY OF THE INVENTION

The electrical contacting device according to the present invention has the advantage of simple and inexpensive manufacturing, while entailing very limited space requirements because of the small unit volume of a flexible printed-circuit board and because of a direct contacting of the connector pins of the fuel-injection valves with the printed conductors of the flexible printed-circuit board. Consequently, the overall height of the device for the electrical contacting of fuel-injection valves, together with the flexible printed-circuit board, has very small dimensions, which represent, for example, 15% of the axial extent of the fuel-injection valves. The reduction in the overall height of the device for electrically contacting fuel-injection valves is significant for internal combustion engines, which will be built with increasingly smaller dimensions in the future and which will require overall arrangements of fuel feeders, fuel-injection valves and devices having a very compact construction for their electrical contacting.

It is particularly advantageous how the joints are formed simply and cost-effectively, in that the fuel-injection valves are connected to the printed conductors of the printed-circuit board using known joining methods, such as soldering, welding or crimping.

The printed-circuit board can be advantageously provided with flexible expansion arches, which run, for example, across the entire width of the printed-circuit board at constant distances between the connector-pin location holes of two fuel-injection valves. These expansion arches are used to provide linear compensation for the printed-circuit board, which can be necessary because of manufacturing tolerances and varying coefficients of thermal expansion of the individual components of the device, such as a circuit-board housing and a fuel feeder, to ensure a dimensionally true assembly.

It is especially advantageous to assemble a circuit-board housing out of a plurality of segments, the expansion arches of the flexible printed-circuit board being unencumbered. The expansion arches of the printed-circuit board, which are unencumbered between the segments, make a linear adjustment of the entire device possible. While the device is being mounted on the fuel feeder or induction pipe, the flexibility of the entire arrangement resulting from the unencumbered expansion arches of the printed-circuit board can be a drawback. Therefore, when manufacturing the circuit-board housing, it is advantageous to also extrude-on bridge elements in the area of the expansion arches on the circuit-board housing. Up until the time when the device is directly assembled, the bridge elements provide the device with an improved intrinsic stability, it being easy to dissociate the bridge elements during assembly to completely expose the expansion arches and allow their previously described effect.

Moreover, it is advantageous to close off the fuel feeder, together with the installed fuel-injection valves and the flexible printed-circuit board, by an at least partially U-shaped cover, which rests at least partially on the fuel feeder. The cover is designed, for example, to be equal in width to the fuel feeder in the area of its top end face. The at least partially U-shaped cross-section of the cover results in the connector pins of the fuel-injection valves and the largest section of the printed-circuit board being upwardly exposed at least in the area of the fuel-injection valves, in a cavity, while they are nevertheless protected by the cover from external influences, a direct contact with the cover being made in the edge areas of the printed-circuit board. The housing constructed as a cover and the fuel feeder can be permanently connected in diverse ways, for example, without connecting elements, by means of friction welding, resistance seam welding or ultrasonic welding, or by means of riveting, threaded assembly, or pin coupling.

It is also advantageous to provide a circumferential seal on the flexible printed-circuit board prior to assembly of the printed-circuit board. The seal, made for example of rubber, may be permanently vulcanized in this case onto the printed-circuit board. It would, therefore, be simpler to assemble this entire subassembly than it would be to install the individual component parts. The seal is accommodated during assembly in a seal groove in the fuel feeder.

BRIEF DESCRIPTION OF THE DRAWINGS

FIG. 10 shows a section along line X—X through a partially U-shaped cover of FIG. 7.

FIG. 11 shows a section along line XI—XI through a completely U-shaped cover of FIG. 7.

DETAILED DESCRIPTION

FIGS. 1 through 11 illustrate examples of devices according to the present invention for the common electrical contacting of a plurality of electrically excitable aggregates, in particular electromagnetically actuated fuel-injection valves, for example for mixture-compressing internal combustion engines with externally supplied ignition. The devices are essentially comprised of a flexible printed-circuit board 1, through which the electrical contacting of fuel-injection valves 2 takes place, and of a housing, designated as a circuit-board housing 3, which are denoted, together, as a contact strip. Spark plugs, glow plugs, inter alia, can likewise serve as electrical aggregates.

Figure 1:
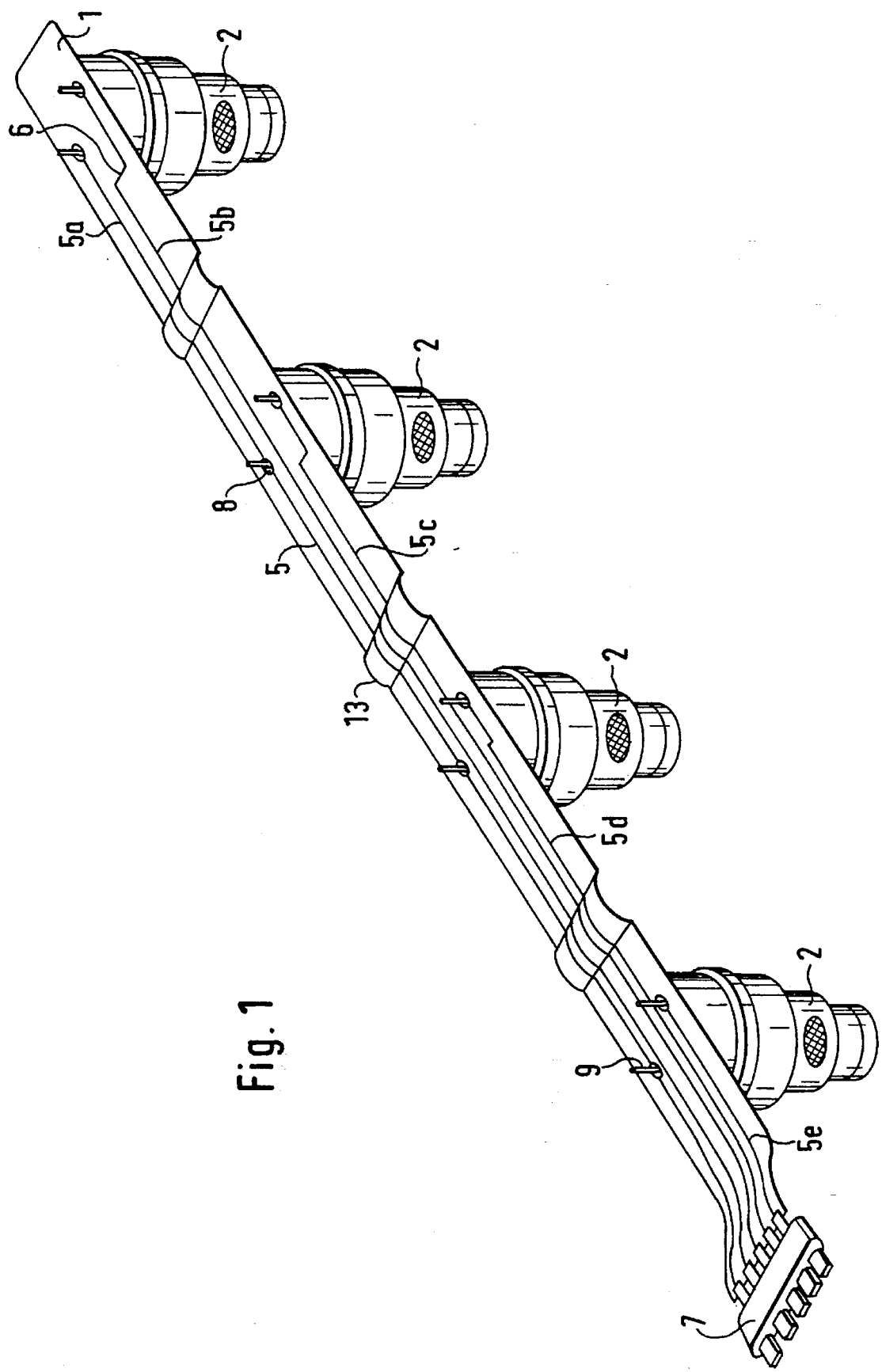
FIG. 1 shows a flexible printed-circuit board with contacted fuel-injection valves.

Referring to FIG. 1, there is shown the first stage of the electrical contacting of the individual fuel-injection valves 2 on the flexible printed-circuit board 1. Electrically conductive printed conductors 5 are produced on the flexible printed-circuit board 1 using known manufacturing methods, which can be characterized briefly as, first, coating a base material with resist; second, performing a photolithographic process comprising light exposure and development of the resist layer; third, producing a conductor pattern through etching; and fourth, removing the resist. One can conceive of widely varying coating techniques to manufacture the printed conductors 5. What is decisive in designing the printed conductors 5 is the geometric position on the printed-circuit board 1. The printed-circuit board 1 has an elongated, narrow shape and, thus, only approximately a width corresponding to the diameter of the fuel-injection valves 2. Provided at one end of the printed-circuit board 1 is a plug connector 7, to which the printed conductors 5 lead and via which the fuel-injection valves 2 can be triggered from a control unit (not shown).

When, for example, four fuel-injection valves 2 are triggered and an individual triggering is desired, it is necessary to produce five printed conductors 5, and to have them extend in the longitudinal direction of the printed-circuit board 1 and have no contact among themselves. A first printed conductor 5a runs thereby almost over the entire length of the printed-circuit board 1, since all four fuel-injection valves 2 must make contact with the first printed conductor 5a. The four other printed conductors 5b, 5c, 5d and 5e extend substantially parallel to the first printed conductor 5a.

However, they run in each case only up to a fuel-injection valve 2 to be contacted. As a result, the second printed conductor 5b for contacting a first fuel-injection valve 2 has a length similar to that of the first printed conductor 5a, while the lengths of the printed conductors 5c, 5d and 5e are reduced by the respective amount of the distance to the following fuel-injection valve 2. The printed conductors 5b, 5c, 5d and 5e are manufactured so as to terminate at their end facing away from the plug connector 7, always at the same lateral distance from the first printed conductor 5a, to guarantee the contacting of the fuel-injection valves 2, so that at least the printed conductors 5b, 5c and 5d have a bend 6, or so that a profile that diverges from the first printed conductor 5a is provided.

The printed-circuit board 1 has a plurality of connector-pin location holes 8 for contacting the fuel-injection valves 2. Projecting into these connector-pin location holes 8 of the printed-circuit board 1 are electrical connector pins 9 of the fuel-injection valves 2, which extend from a solenoid coil 10 (FIGS. 5 and 6) out of the fuel-injection valve 2 and through which the solenoid coil 10 is excited. The connector-pin location holes 8 are already provided when the printed conductors 5 are produced on the printed-circuit board 1, so that contact difficulties are avoided later on. When there is one printed-circuit board 1 for triggering four fuel-injection valves 2 with two electrical connector pins 9 each, the result is eight connector-pin location holes 8.

At a distance from the fuel-injection valves 2 to be mounted, four connector-pin location holes 8 are introduced in this case to the first printed conductor 5a, while each of the printed conductors 5b, 5c, 5d and 5e terminates in a connector-pin location hole 8. The two connector-pin location holes 8 for the two connector pins 9 of a fuel-injection valve 2 are each introduced at a constant distance to the printed-circuit board 1 and, therefore, make it possible for the connector pins 9 of the fuel-injection valves 2 to be easily inserted. A permanent electrical connection can be established between the connector pins 9 of the fuel-injection valves 2 and the printed conductors 5 of the printed-circuit board 1, for example, by means of soldering, welding or crimping, i.e., a solderless squeezing. In place of the flexible printed-circuit board 1 with its printed conductors 5, it is conceivable to use only individually insulated cables for the contacting, which then, however, together with the fuel-injection valves 2 prior to the plastic extrusion-coating of (injecting molding all around) a housing, represent a more unstable system.

The printed-circuit board 1 can be advantageously provided with flexible expansion arches 13, each situated, for example, at constant distances between the connector-pin location holes 8 of two fuel-injection valves 2 over the entire width of the printed-circuit board 1. These expansion arches 13 are used to provide linear compensation for the printed-circuit board 1, which can be necessary because of manufacturing tolerances and varying coefficients of thermal expansion of the circuit-board housing 3, which later at least partially surrounds the printed-circuit board 1, and, for example, of the induction pipe of the internal combustion engine, to which the contact strip is secured, to ensure a dimensionally true assembly. For example, the five-pole plug connector 7 is connected in a generally known way, for example, by soldering it to the printed conductors 5 of the flexible printed-circuit board 1.

Figure 2:
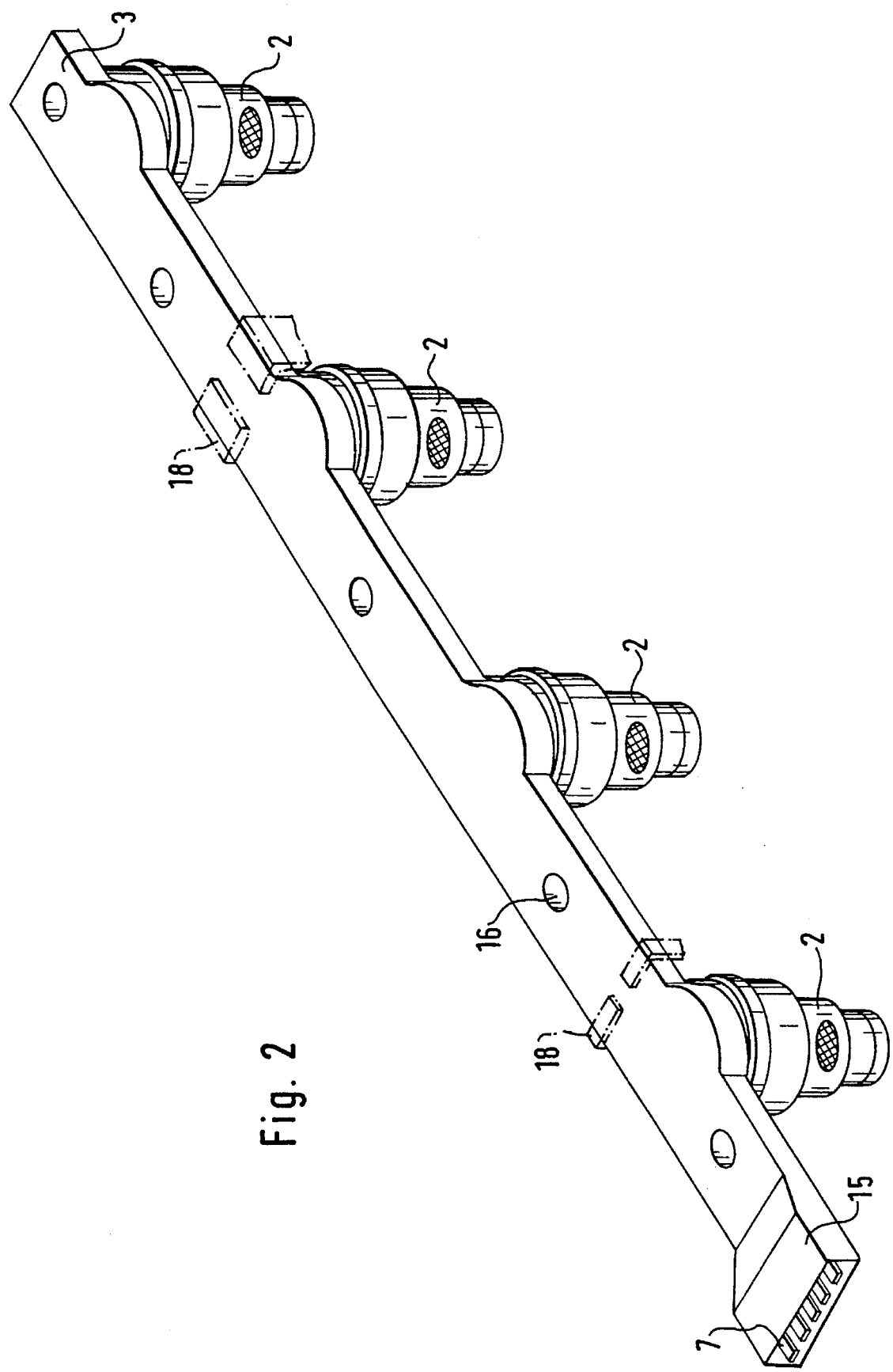
FIG. 2 shows a contact strip with a circuit-board housing surrounding the printed-circuit board.

Referring now to FIG. 2, there is illustrated a first variant of the circuit-board housing 3, designed, for example, as a plastic injection-molded part. The circuit-board housing 3 extends over the entire length of the printed-circuit board 1 and completely surrounds it. To simplify the extrusion-coating method, the plug connector 7 is surrounded, for example, by a plug-connector housing 15, which is formed in one piece with the circuit-board housing 3. Several possibilities ensue for securing the contact strip comprised of the printed-circuit board 1, the circuit-board housing 3, the plug connector 7, and the plug-connector housing 15, together with the contacted fuel-injection valves 2, to the fuel feeder (not shown) or to the induction pipe of the internal combustion engine, as indicated in FIG. 2. One very simple variant is a threaded assembly, in that, for example, holes 16 are introduced centrically and at constant distances in the longitudinal direction of the printed-circuit board 1 in the circuit-board housing 3; and in that these holes 16 must be situated outside of the connector pins 9 of the fuel-injection valves 2; and that attachment screws are introduced into these holes 16, for example, on the induction pipe.

Figure 3:
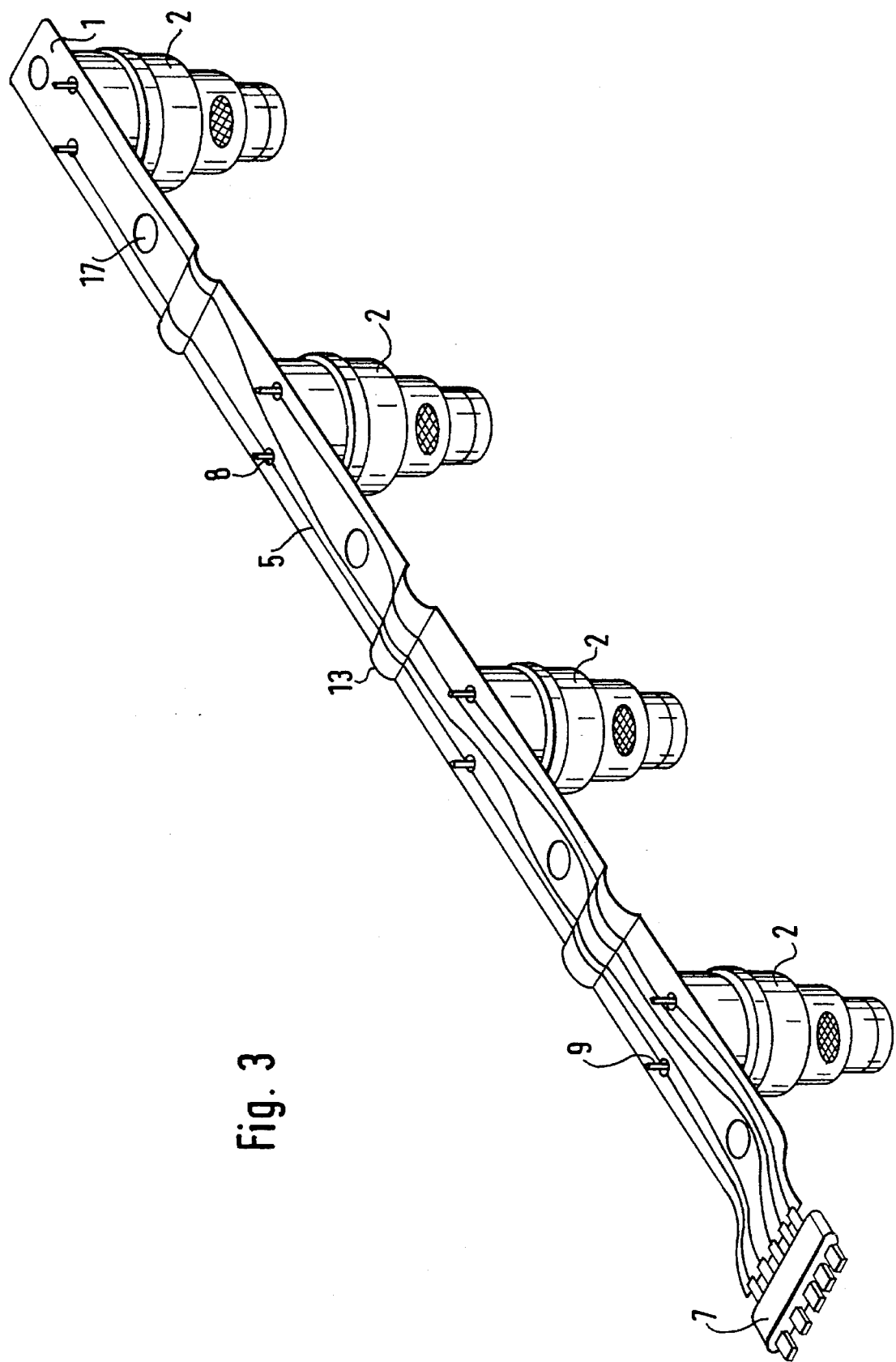
FIG. 3 shows a flexible printed-circuit board with contacted fuel-injection valves and through-holes for attaching the entire contact strip.

Referring now to FIG. 3, in accordance with the geometric arrangement of the holes 16 in the circuit-board housing 3 of FIG. 2, through-holes 17 must also be provided in the printed-circuit board 1.

Therefore, for this type of attachment, it is necessary that the refinement of the printed conductors 5 deviate from FIG. 1. The printed conductors 5 must, namely, follow a pattern in the printed-circuit board 1 that deviates from parallelism, at least in the area of the through-holes 17, without the printed conductors 5 being in contact with one another. Nowadays, it is easy to manufacture a wide variety of patterns of printed conductors 5, and it is simple to vary them to correspond to desired ways for securing the contact strips. Besides securing the contact strip by means of a threaded assembly, other attachment possibilities are conceivable, in which case additional retaining devices 18, as shown in FIG. 2, or retaining elements already provided on the induction pipe of the internal combustion engine are used and engage with the contact strip. Using such retaining devices 18 as shown in FIG. 2 entirely eliminates the need for the through-holes 17 in the printed-circuit board 1 and the holes 16 in the circuit-board housing 3.

Figure 4:
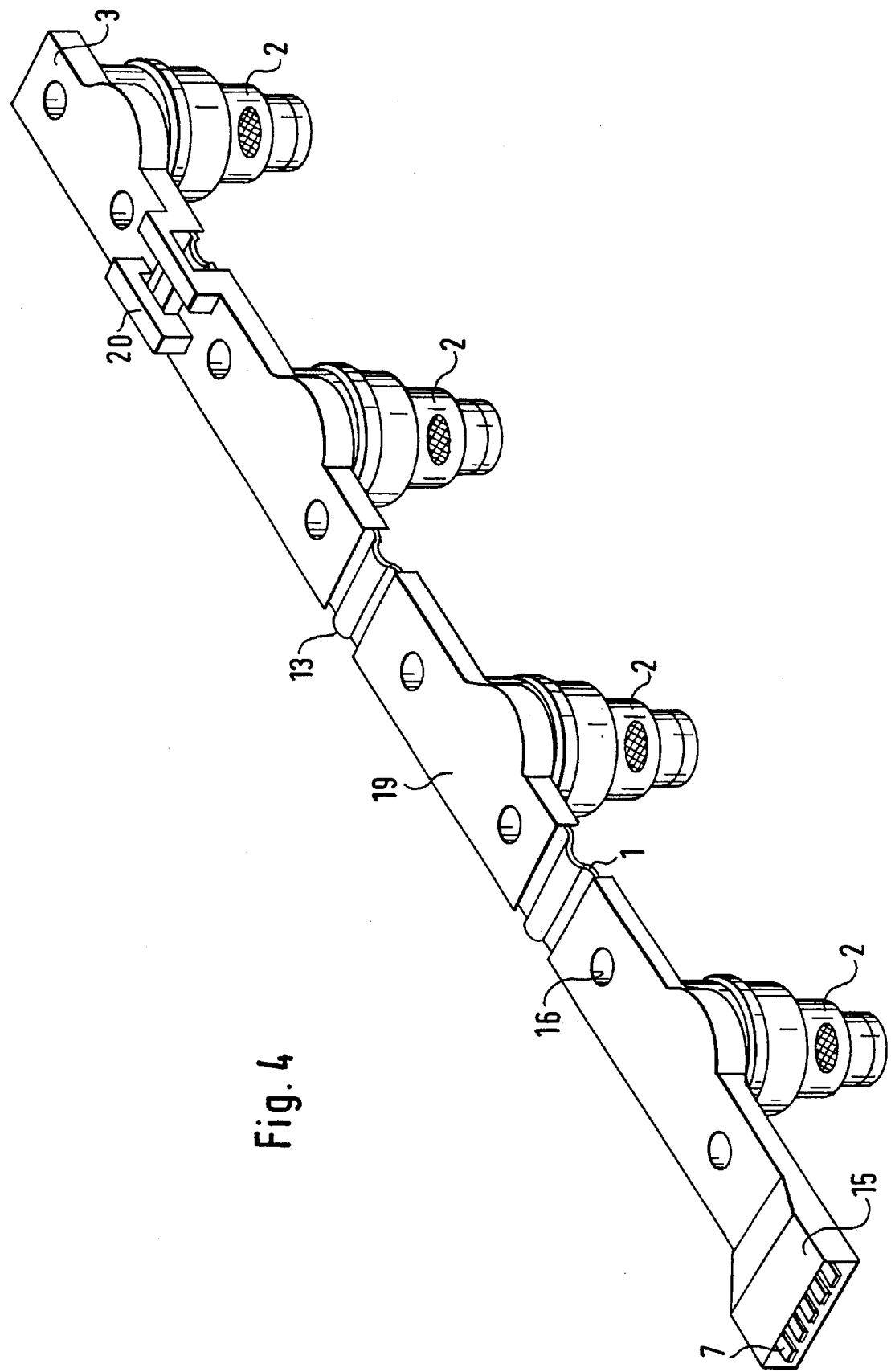
FIG. 4 shows a contact strip with a circuit-board housing assembled from a plurality of segments and with a printed-circuit board having expansion arches.

FIG. 4 clearly shows a different extrusion-coating variant than that shown in FIG. 2. In this exemplary embodiment, parts remaining the same and having the same function are characterized by the same reference symbols as they are in the exemplary embodiments of FIGS. 1 through 3. In this exemplary embodiment, the circuit-board housing 3 is multisectional, since there is no plastic extrusion-coating of the flexible printed-circuit board 1 in the area of the expansion arches 13. The unencumbered expansion arches 13 of the printed-circuit board 1 render possible a linear variation of the entire contact strip. This is significant, since varying coefficients of thermal expansion of the circuit-board housing 3 made of a plastic and of the, for example, metallic induction pipe of the internal combustion engine would jeopardize a dimensionally true assembly. The expansion arches 13 are, thus, used to compensate for manufacturing tolerances and for thermal stresses occurring among various materials and, thus, to provide linear compensation for individual segments 19 of the circuit-board housing 3, thus guaranteeing that the contact strip is attached with positional accuracy.

When the contact strip is installed on the fuel feeder or on the induction pipe, the flexibility of the individual segments 19 of the circuit-board housing 3 and, thus, of the entire subassembly resulting from the unencumbered expansion arches 13 of the printed-circuit board 1 can be a drawback. Therefore, when manufacturing the circuit-board housing 3, it is beneficial to also extrude on bridge elements 20 in the area of the expansion arches 13 on the circuit-board housing 3. The bridge elements 20 are short connecting members, which are arranged, for example, in pairs between two segments 19 each of the circuit-board housing 3 and do not exceed the width of the circuit-board housing 3. Up until the time when the contact strip is directly installed, the bridge elements provide the contact strip with an improved intrinsic stability, while during the assembly operation the bridge elements 20 are easily dissociated, for example one behind the other at the individual expansion arches 13, thus completely exposing the expansion arches 13 and, consequently, allowing their previously described effect.

Figure 5:
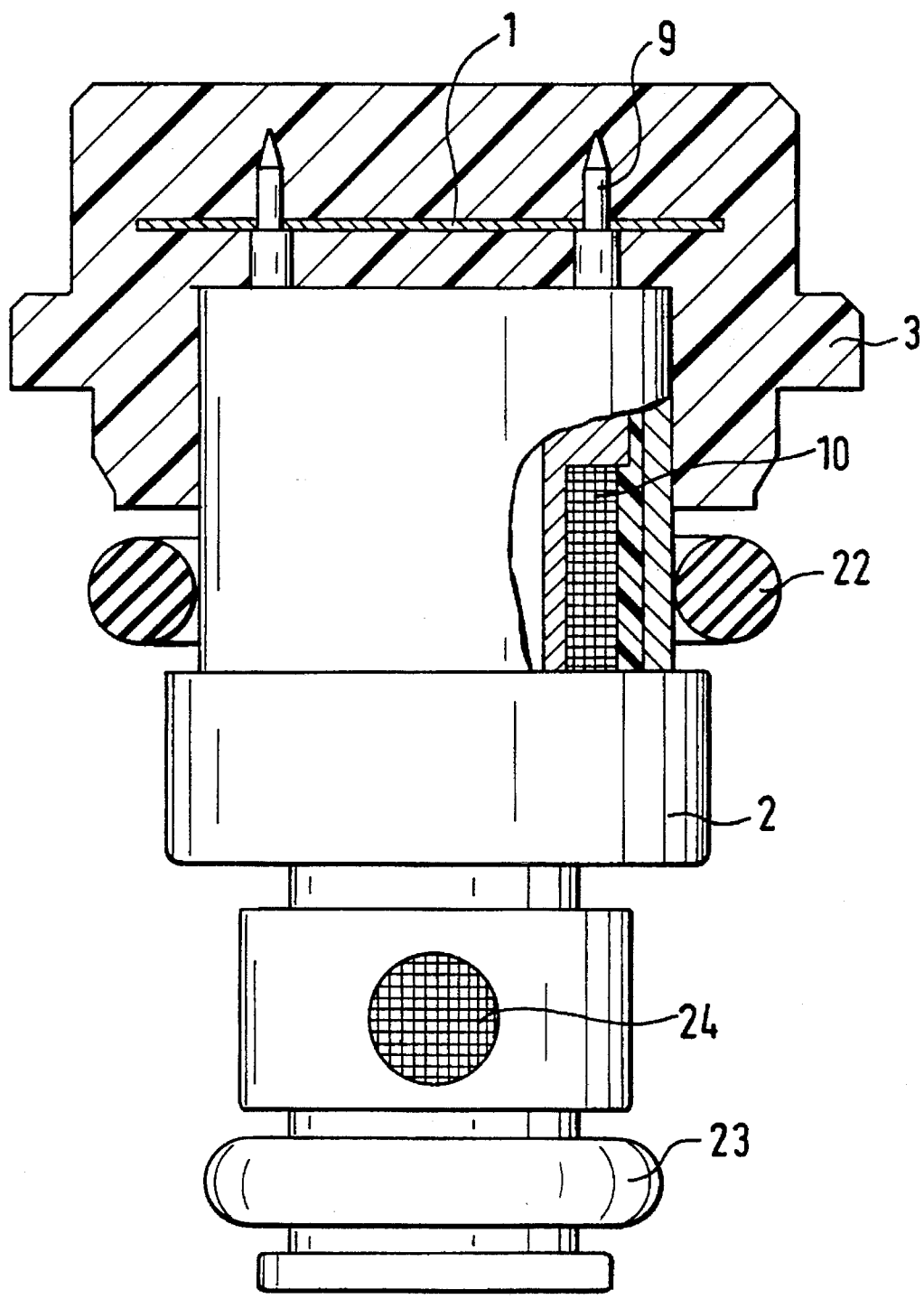
FIG. 5 shows a partial longitudinal cross-section through a fuel-injection valve with its mounting attachment on the flexible printed-circuit board.

FIG. 5 shows a partial longitudinal section through a fuel-injection valve 2, with its attachment to the flexible printed-circuit board 1 and the circuit-board housing 3 surrounding this printed-circuit board 1. Here, the circuit-board housing 3 has, for example, a stepped outer contour, which extends up to an upper sealing ring 22 of the fuel-injection valve 2. Together with a lower sealing ring 23, the upper sealing ring 22 is used to seal off the fuel-injection valve 2 in the fuel feeder (not shown), in which the fuel is made available for supplying the so-called bottom-feed injection valves 2 used here. The fuel arrives via a filter screen 24 inside the fuel-injection valve 2, from where it is sprayed off as a finely atomizod spray in accordance with the triggering of the solenoid valve 10 and the resultant opening and closing cycles of the fuel-injection valve 2. In the case of the exemplary embodiment shown in FIG. 5, the connector pins 9, the printed-circuit board 1 and the periphery of the fuel-injection valve 2 are directly and completely surrounded above the upper sealing ring 22 by the plastic extrusion-coating of the circuit-board housing 3.

Figure 6:
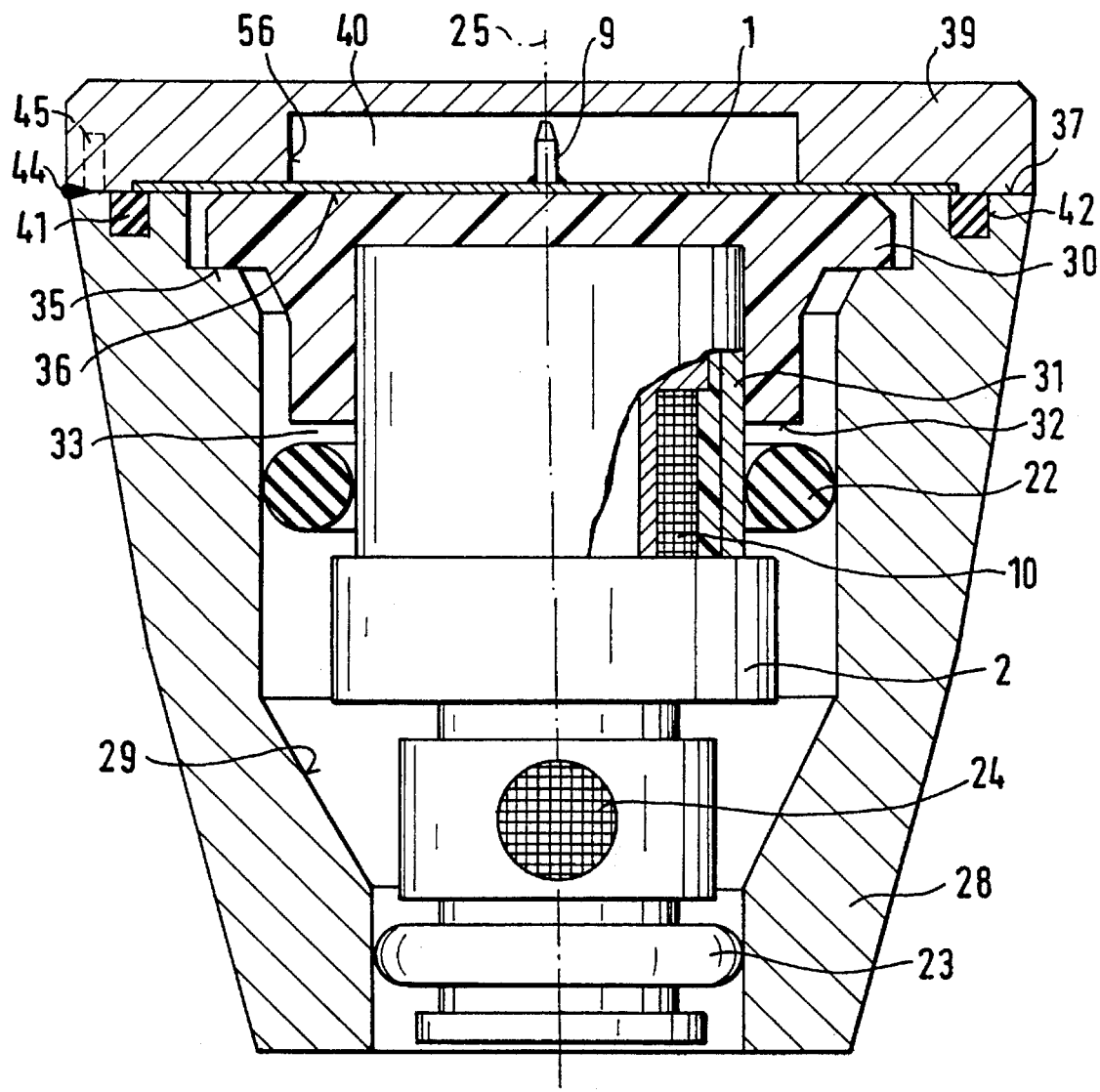
FIG. 6 shows a partial longitudinal cross-section through a fuel-injection valve with its mounting attachment on the flexible printed-circuit board and with a housing designed as a cover.

Another exemplary embodiment according to the present invention is illustrated in FIG. 6, showing a partial longitudinal section through a fuel-injection valve 2 with its attachment to the flexible printed-circuit board 1. The fuel feeder 28, mentioned already several times in the above, is schematically depicted in FIG. 6 and can be, for instance, a component of an induction pipe of the internal combustion engine or an independent part. The fuel feeder 28 is designed so as to allow the fuel-injection valves 2 to be inserted into stepped openings 29, which each extend concentrically around a longitudinal valve axis 25 in the same way as the fuel-injection valves 2 themselves. After installation of the fuel-injection valve 2 in the fuel feeder 28, the two sealing rings 22 and 23 of the fuel-injection valve 2 abut against the inner wall of the opening 29 and, thus, ensure that the periphery of the fuel-injection valve 2 is sealed off to the outside.

In this exemplary embodiment, a valve-housing head 30, for example of plastic, constitutes the upper closure of the fuel-injection valve 2, out of which only the connector pins 9 project. This valve-housing head 30 has, for instance, a cup shape with a stepped outer contour and likewise extends concentrically to the longitudinal valve axis 25. After being slip-fit or pressed on to a valve body 31 of the fuel-injection valve 2, the valve-housing head 30 reaches in the axial direction up to the upper sealing ring 22 and, with its lower boundary surface 32, forms there a part of a groove 33, in which the upper sealing ring 22 is situated. In the upper area of the opening 29 of the fuel feeder 28, a shoulder 35 is provided, against which the valve-housing head 30 and, thus, the entire fuel-injection valve 2 can be braced. Resting on an upper boundary surface 36 of the valve-housing head 30 is the flexible printed-circuit board 1, which is contacted at the connector pins 9 and extends widthwise up to an upper end face 37 of the fuel feeder 28.

The fuel feeder 28, together with the installed fuel-injection valves 2 and the flexible printed-circuit board 1 connected to them, is closed off in this case by a cover 39, which has an at least partially U-shaped cross-section and rests at least partially on the top end face 37 of the fuel feeder 28. The cover 39, which serves as a housing for the device, is designed, for instance, to be equal in width to the fuel feeder 28 in the area of its top end face 37. The at least partially U-shaped cross-section of the cover 39 results in the connector pins 9 and the largest section of the printed-circuit board 1 being upwardly exposed in the area of the fuel-injection valves 2, in a cavity 40, while they are nevertheless protected by the cover 39 from external influences, while there is a direct contact with the cover 39 in the edge areas of the printed-circuit board 1.

Vulcanized onto the printed-circuit board 1 over the entire periphery is, for instance, a seal 41, which engages with a seal groove 42 at the upper end face 37 of the fuel feeder 28. Viewed in the axial extension direction of the fuel-injection valve 2, the seal 41 can be formed beth on one side of the printed-circuit board 1 only, as well as additionally so as to wrap around the edge area of the other side of the printed-circuit board 1. A flexible printed-circuit board 1 comprising a seal 41 vulcanized on to it can be seen schematically in FIG. 9. After installation of the fuel-injection valves 2 and the flexible printed-circuit board 1, a permanent connection 44 between the cover 39 and the fuel feeder 28 can be established in diverse ways. Thus, it is possible to join the two component parts without using any additional connecting elements, for example, by means of friction welding, resistance seam welding or ultrasonic welding. Moreover, one can conceive of non-integral jointing methods 45 for joining both component parts, for instance riveting, threaded assembly methods, or pin coupling.

Figure 7:
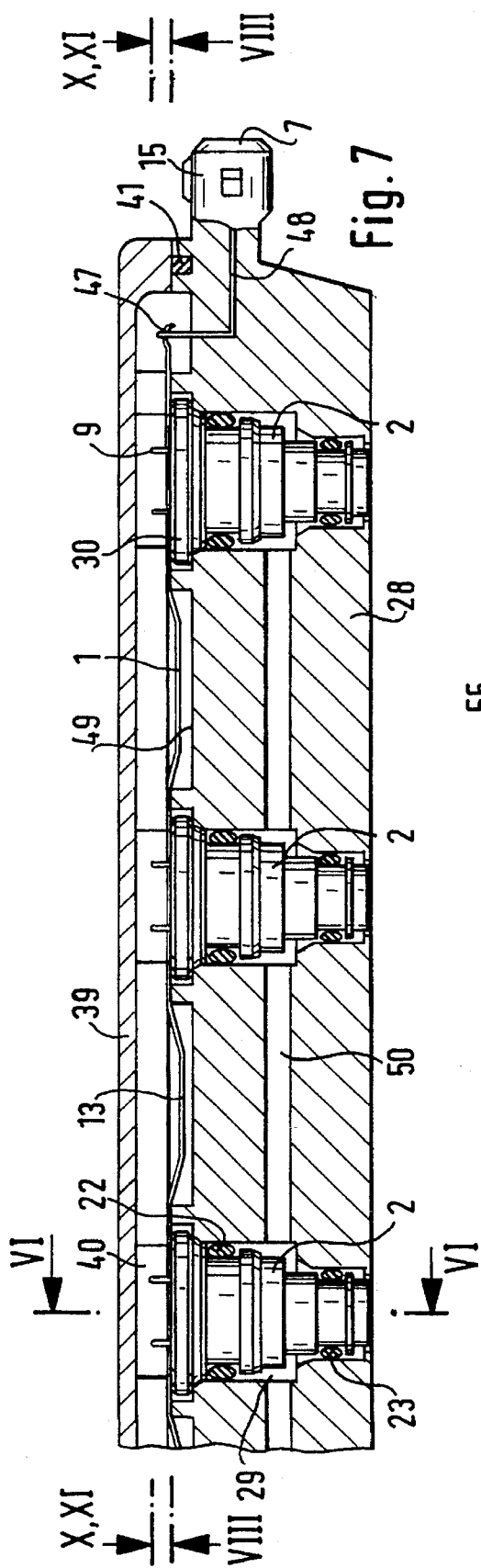
FIG. 7 shows a contact strip, together with a fuel feeder.
Figure 8:
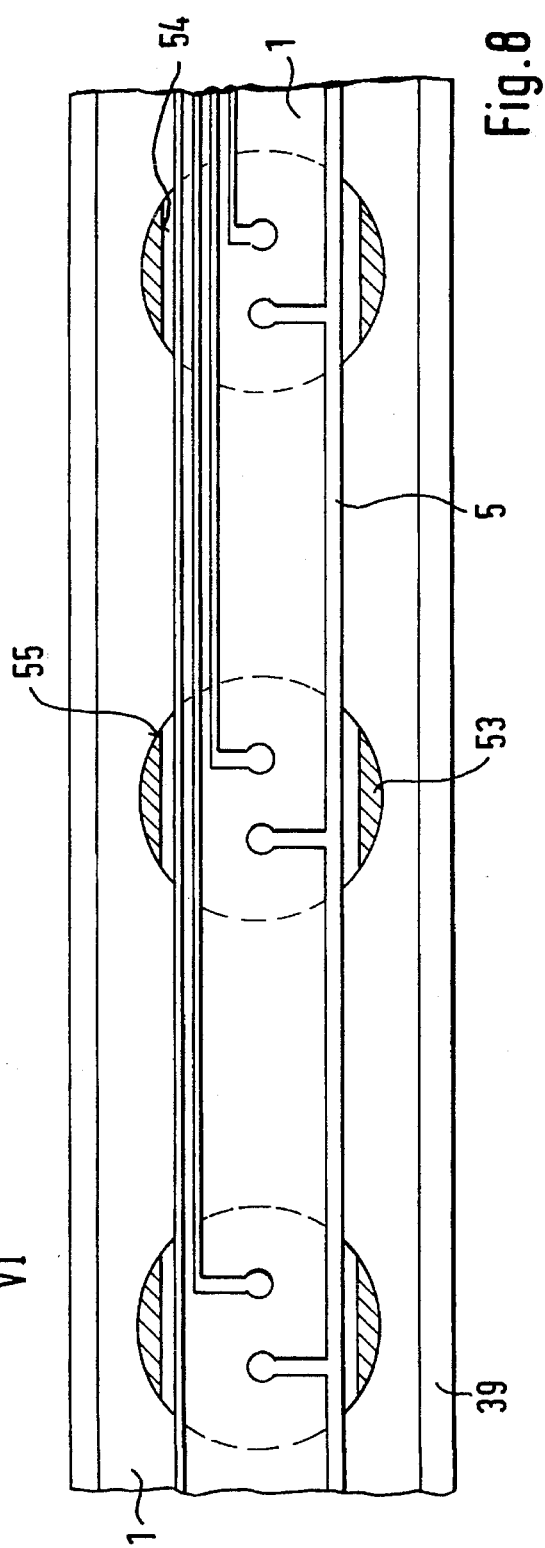
FIG. 8 shows a section along line VIII—VIII in the circuit-board plane of FIG. 7.

FIGS. 7 and 8 depict the fuel feeder 28 with the installed fuel-injection valves 2, and with the flexible printed-circuit board 1 at least partially. In comparison to previous exemplary embodiments, the reference symbols used in this exemplary embodiment remain the same for the same parts or parts having the same function. In contrast to the exemplary embodiments shown in FIGS. 1 through 5, here, as can also be seen already in FIG. 6, the fuel-injection valves 2 are installed twisted by 90°. Thus, viewed in the longitudinal direction of the printed-circuit board 1, the connector pins 9 of a fuel-injection valve 2 no longer project through the printed-circuit board 1 side-by-side, but rather one behind the other. However, no functional variation results from this spatial variation.

In this exemplary embodiment, the plug connector 7 with the plug-connector housing 15 exists in a modified form and is part of the fuel feeder 28. Situated on the printed conductors 5 at the end of the printed-circuit board 1 facing the plug connector 7 are soldering eyelets 47, into which, for instance, right-angled terminal posts 48 are soldered with their one end, while their other end leads directly to the contacts of the plug connector 7. To compensate for linear differences, which can result from different coefficients of thermal expansion of the materials being used, it is again expedient to provide expansion arches 13 between the respective connection points of the connector pins 9 of the fuel-injection valves 2 and the printed-circuit board 1, which can lie exposed with no risk of damage because of the depressions 49 introduced in the fuel feeder 28.

A fuel-supply line 50 running in the longitudinal direction of the printed-circuit board 1 and of the fuel feeder 28 is arranged in the fuel feeder 28. The fuel-supply line 50 represents a connection of all openings 29 located in the fuel feeder 28 for the fuel-injection valves 2. The fuel required by all fuel-injection valves 2 is made available via the fuel-supply line 50 and is then sprayed off through the fuel-injection valves 2 as a finely atomized spray in accordance with the electrical actuation.

FIG. 8 shows a section along the line VIII—VIII in the plane of the printed-circuit board 1 in FIG. 7. In this section, tie-down pins 53 having a, for example, circular-segment-shaped cross-section become visible, which belong directly to the cover 39. Premolded on the cover 39 in the area of each fuel-injection valve 2 are, for example, two tie-down pins 53, which project in such a way out of the cover 39 in the direction of the fuel-injection valve 2 that, with their flat surfaces 54, they represent the extensions of flattened inner walls 56 of the at least one cavity 40 of the cover 39. The tie-down pins 53 of the cover 39 project through the printed-circuit board 1 in pin cut-outs 55 provided for that purpose and press on the upper boundary surface 36 of the valve-housing head 30 of the fuel-injection valve 2. The pin cut-outs 55 in the printed-circuit board 1 have more or less the same circular-segment-shaped cross-sectional shape as the tie-down pins 53, as is quite apparent in FIG. 9, so that little slack results because of the good accuracy of fit. During operation of the internal combustion engine, vibrations and the surface difference between the upper sealing ring 22 and the lower sealing ring 23 lead to dynamic effects, which could result in a minimal slipping of the fuel-injection valves 2. This danger is completely avoided by the tie-down pin 53 of the cover 39 pressing on the fuel-injection valves 2.

Figure 9:
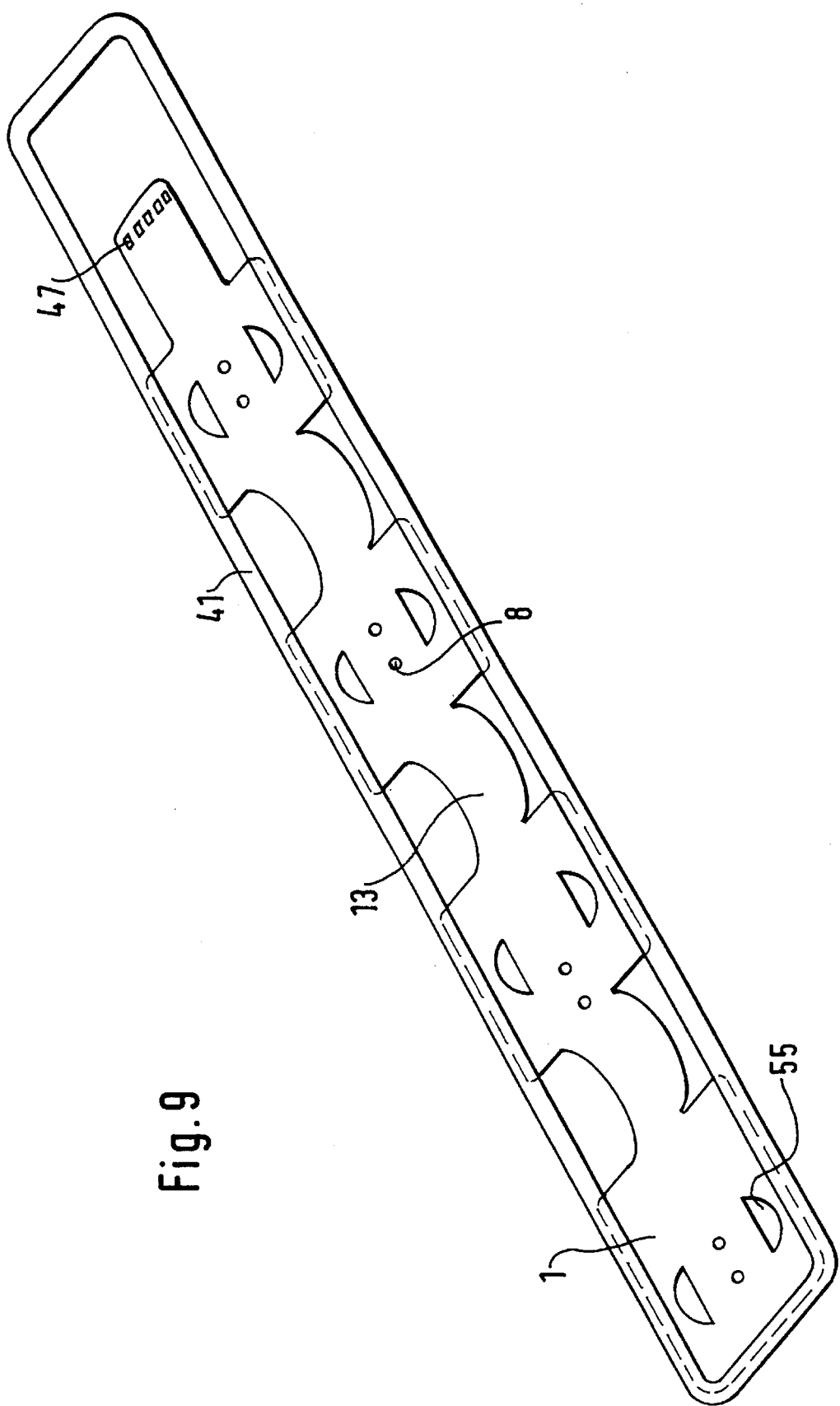
FIG. 9 shows a flexible printed-circuit board having a vulcanized seal.

FIG. 9 depicts a flexible printed-circuit board 1 without printed conductors, on to which is vulcanized the circumferential seal 41, which projects to the outside over the printed-circuit board 1. Because of their permanent connection, the printed-circuit board 1 and the seal 41, for example of rubber, form a subassembly still prior to the contacting of the fuel-injection valves 2 and the installation in the fuel feeder 28. It is now substantially simpler to mount this subassembly than it would be to install individual component parts. The fuel-injection valves 2 are first inserted into the appropriate openings 29 in the fuel feeder 28, and the subassembly comprised of the printed-circuit board 1 and the seal 41 are subsequently mounted on the inserted fuel-injection valves 2. After that, the electrical connections are undertaken, on the one hand, the contacting of the fuel-injection valves 2 with the printed conductors 5 of the printed-circuit board 1 and, on the other hand, the manufacturing of an electrically conductive connection between the printed-circuit board 1 and the plug connector 7 with the terminal posts 48. At the same time, the circumferential seal 41 on the printed-circuit board 1 is inserted into the seal groove 42 of the fuel feeder 28.

FIGS. 10 and 11 are transverse representations along the lines X—X and XI—XI through the cover 39 in FIG. 7. Here, FIG. 10 shows a first exemplary embodiment of a formation of the cavities 40. In this case, one cavity 40 is formed for each fuel-injection valve 2 by placing the cover 39 on the fuel-injection valve 2 or rather on the fuel feeder 28. Thus, the individual cavities 40 are not interconnected, but rather are separated from one another by the material of the cover 39 that reaches down to the printed-circuit board 1. The cavities 40 are substantially circular with approximately the same diameters as the upper sealing rings 22 of the fuel-injection valves 2, but in the area of the tie-down pins 53 extending in the direction of the fuel-injection valves 2, they have the flattened inner walls 56 because of the pin cut-outs 55 in the printed-circuit board 1. The circular shape of the cavities 40 continues as the outer contour of the circular-segment-shaped tie-down pins 53, as illustrated by the dotted lines. The flattened inner walls 56 of the cavities 40 change smoothly into the flat surfaces 54 of the tie-down pins 53 and each form a plane.

FIG. 11 depicts a second exemplary embodiment in which a single cavity 40 extends in the cover 39. Thus, the cover 39 still rests only on the edge areas of the printed-circuit board 1. At this point, the cavity 40 of the cover 39 is still only delimited right through by flat walls 57. Here as well, the circular-segment-shaped tie-down pins 53 on the cover 39, or the pin cut-outs 55 in the printed-circuit board 1 are shown with dotted lines.

What is claimed is:

1. An apparatus for providing a common electrical contact to a plurality of excitable aggregates of an internal combustion engine having connector pins for electrical contacting, comprising:

a printed-circuit board extending to all of the aggregates, the printed-circuit board including printed conductors connected to the aggregates via the connector pins, the connection being made by a direct contacting of the connector pins to the printed conductors; and a housing at least partially surrounding the printed-circuit board.

2. The apparatus of claim 1, wherein the aggregates include electromagnetically actuated fuel injection valves.

3. The apparatus of claim 1, wherein the printed-circuit board further includes a plurality of connector pin location holes therethrough into which the connector pins are introduced, the connector pins being connected to the printed conductors by means of welding.

4. The apparatus of claim 1, wherein the printed-circuit board further includes a plurality of connector pin location holes therethrough into which the connector pins are introduced, the connector pins being connected to the printed conductors by means of soldering.

5. The apparatus of claim 1, wherein the printed-circuit board further includes a plurality of connector pin location holes therethrough into which the connector pins are introduced, the connector pins being connected to the printed conductors by means of crimping.

6. The apparatus of claim 1, further comprising a plug connector coupled to the printed-circuit board.

7. The apparatus of claim 1, wherein the housing completely surrounds the printed-circuit board.

8. The apparatus of claim 7, wherein the housing is constructed as a plastic extrusion coating.

9. The apparatus of claim 1, wherein the housing includes a cover for covering a side of the printed-circuit board opposite the aggregates.

10. The apparatus of claim 9, wherein the cover has a U-shaped cross section, at least in an area of the aggregates.

11. The apparatus of claim 9, wherein the cover includes a plurality of tie down pins premolded to the cover, the printed-circuit board having holes therethrough, the tie down pins passing through the holes in the printed-circuit board, the tie down pins being coupled to the aggregates to hold the aggregates in predetermined positions.

12. The apparatus of claim 1, wherein the printed-circuit board is surrounded by a circumferential seal.

13. The apparatus of claim 12, wherein the circumferential seal is vulcanized onto the printed-circuit board.

14. The apparatus of claim 9, wherein the aggregates are fuel-injection valves, the valves including a fuel feeder and a fuel-supply line, such that the printed-circuit board is disposed between the fuel feeder and the cover.

15. The apparatus of claim 14, further comprising a plug connector coupled to the fuel feeder and coupled to the printed conductors of the printed-circuit board.

16. The apparatus of claim 14, wherein the fuel feeder includes a seal groove for inserting a circumferential seal on the printed-circuit board.

17. An apparatus for providinq a common electrical contact to a plurality of excitable aggregates of an internal combustion engine having connector pins for electrical contacting, comprising:

a printed-circuit board extending to all of the aggregates, the printed-circuit board including printed conductors connected to the aqgregates via the connector pins;

a housing at least partially surrounding the printed-circuit board;

wherein the printed-circuit board further includes a plurality of flexible expansion arches.

18. The apparatus of claim 17, wherein the housing includes a plurality of segments corresponding to a number of aggregates such that each expansion arch lies unencumbered between two segments.

19. The apparatus of claim 18, further comprising dissociable bridge elements for coupling the segments of the housing to one another.

20. An apparatus for providing a common electrical contact to a plurality of excitable aggregates of an internal combustion engine having connector pins for electrical contacting, comprising:

a printed-circuit board extending to all of the aggregates, the printed-circuit board including printed conductors directly connected to the aggregates via the connector pins;

a housing at least partially surrounding the printed-circuit board;

wherein the housing includes a plurality of holes therethrough, and the printed-circuit board includes a plurality of corresponding holes therethrough, through which the connector pins are coupled to the printed conductors by threaded assembly.

* * * * *